United States Patent [19]
Bessho et al.

[11] Patent Number: 5,933,017
[45] Date of Patent: Aug. 3, 1999

[54] PROBER INTERFACE CARD FOR SHORTENING THE SETTLING TIME

[75] Inventors: Yoshiyuki Bessho; Hideo Akama; Norio Sone, all of Tokyo, Japan

[73] Assignee: Hewlett-Packard Company, Palo Alto, Calif.

[21] Appl. No.: 08/657,706

[22] Filed: May 30, 1996

[30] Foreign Application Priority Data

May 31, 1995 [JP] Japan .................................. 7-157146

[51] Int. Cl.$^6$ .................................................. G01R 1/073
[52] U.S. Cl. ........................................... 324/754; 324/762
[58] Field of Search .................... 324/72.5, 754, 324/762

[56] References Cited

U.S. PATENT DOCUMENTS 3,891,924  6/1975  Ardezzone et al. ................ 324/72.5
4,593,243  6/1986  Lao et al. ............................ 324/754
4,636,722  1/1987  Ardezzone .......................... 324/754
5,557,214  9/1996  Barnett ................................ 324/762

OTHER PUBLICATIONS

IBM Ceramicard Connection, 1994–95 (month unavailable) Winter, vol. 1 (pp. 1–6).

Microprobe Update, vol. 26, 1995, (month unavailable) (pp. 1–7).

Primary Examiner—Ernest Karlsen

[57] ABSTRACT

A prober interface card is provided which improves dielectric absorption characteristics between needles and signal patterns, and conductors with different potentials. A side guard conductor, having a specific height and depth, is disposed so that there is no insulating material between a needle with a connected signal pattern and an adjacent needle with its side guard conductor.

4 Claims, 5 Drawing Sheets

5,933,017

PROBER INTERFACE CARD FOR SHORTENING THE SETTLING TIME

FIELD OF THE INVENTION

This invention relates to a tool for measuring semiconductor wafers. More specifically, it concerns an interface card which connects a measuring device and the wafer in a wafer prober and which can greatly shorten a settling time (the time until an error current becomes small enough not to affect the measurement) when low currents are measured.

BACKGROUND OF THE ART

There has been marked progress in semiconductor manufacturing technology in recent years. Progress in micro-operations, required by high-density integration, is no exception. In order to achieve high-density packaging, heating of the semiconductors has been decreased and device sizes have been reduced, so that operating currents and voltages in the semiconductors have become to be reduced. The importance of measuring low currents to achieve these reductions is increasing. More accuracy is required in measuring such low currents and in the implements used to make such measurements.

Process monitoring in wafer production is no exception to this. In a conventional method of process monitoring, measurement chips called TEGs (test element groups) are formed in the wafers at the same time as the chips are formed, and are measured to examine device characteristics of the wafer. Interface cards for wafer probers (prober interface cards) are interface cards which mediate between the measurement device and the device which carries/positions the wafer being measured. Interface cards are provided with a number of contact needles surrounding a circular hole in the card, for contacting the measurement terminals of the wafer.

FIG. 1 shows a conceptual diagram of a prior art prober interface card, called probe card 1. FIG. 2 is an enlarged diagram which makes the structure of the needle mounting part easily distinguishable. FIG. 3 is a cross section of FIG. 2, through line a—a'. In FIG. 2, needles 11 and 21 contact terminals 32 and 33 on wafer 31. Signals from terminals 32 and 33 on the wafer pass through respective needles 11 and 21, conductive leads, or signal patterns 12 and 22 on probe card 1, and are then connected to the measurement device (not shown in FIG. 1–3) through terminals (not shown in FIG. 1–3).

Patterns 13 and 23 on probe card 1 are guard patterns (side guard patterns). For example, side guard pattern 13 functions in such a way that currents from the outside through insulator 51 do not flow into signal pattern 12. Patterns 14 and 24 in the substrate of FIG. 3 are also guard patterns (lower guard patterns) which lie in parallel below signal patterns 12 and 22 respectively. For example, lower guard pattern 14 functions in such a way that currents do not pass from the reverse side through insulator 51 of probe card 1 and into signal pattern 12. These lower guard patterns 14 and 24 can also be placed on the reverse side of the substrate, as well as inside it.

Ordinarily, side guard pattern 13 forms an active guard, being given the same potential as needle 11, but it may also be fixed at ground potential, so that it acts as a passive guard. Side guard pattern 23 has the same function with respect to needle 21. Furthermore, only the connections of two needles are shown in FIG. 2, but in fact many needles are provided.

In recent years, measurement accuracies at the fA (femtoampere) level have come to be required in these prober interface cards, but it has been difficult to develop probe cards with the required specifications. One of the reasons for this is the problem of dielectric absorption in the needle mounting parts, which are highly densely spaced.

That is, since many needles are arranged in narrow spaces on the needle mounting parts, it is important to consider the magnitude of dielectric absorption of the pathways from the various needles to the lower guard patterns of adjacent needles through the insulator of the substrate. The magnitude of this dielectric absorption has a large effect on the settling time of the measurement.

On the other hand, use of single-channel coaxial probes makes possible fA-order measurements without use of such cards. However, positioning accuracy of the needles of such probes is poor, and the apparatus is large, so there are restrictions on the number of channels which can be implemented. In addition, such devices are comparatively expensive, and in recent years TEGs become more complex and require many contact probes. As the result, it is not fit for the newest TEGs.

The problems of conventional probe cards will be explained in more detail by use of FIG. 4 which shows an equivalent circuit of the needle part of FIG. 3. In FIG. 4, terminal 211 indicates the potential of needle 11 and signal pattern 12 of FIG. 3. Similarly, terminal 221 indicates the potential of needle 21 and signal pattern 22. Terminal 213 indicates the potential of side guard pattern 13 and lower guard pattern 14, and terminal 223 indicates the potential of side guard pattern 23 and lower guard pattern 24. C12 is the capacitance between terminals 211 and 221, C13 the capacitance between terminals 211 and 213, C24 the capacitance between terminals 221 and 223, C14 the capacitance between terminals 211 and 223, C23 the capacitance between terminals 221 and 213, and C34 the capacitance between terminals 213 and 223. In the equivalent circuit of FIG. 4, the resistance parts have been omitted which are present between the terminals.

In the equivalent circuit shown in FIG. 4, when measurement conditions are changed, the voltage between terminals 211 and 221 changes. In order to simplify the explanation, the case shall be considered in which the voltage of terminal 221 is constant. When the voltage of terminal 211 changes, capacitances C12 and C14 are charged. Since the voltage of terminal 213 is kept equal to that of terminal 211 by the measuring device, C13 can be ignored. Moreover, since C34 is not connected to measurement terminals 211 and 221, it is also ignored.

C12 is the capacitance between the needle 11 and signal pattern 12, and needle 21 and signal pattern 22, of FIG. 3. Since air is only material between these conductors, it is charged instantly. However, C14 is the capacitance between signal pattern 11 and needle 12, and side guard pattern 23 and lower guard pattern 24, in FIG. 3. Since shaded parts 101, 102, 103, etc., of insulator 51 of FIG. 3 are interposed, as insulating parts, in the capacitance space formed by these terminals, the following problem arises.

Ordinarily, a larger or smaller dielectric absorption property (dielectric excess effect) is present in insulating parts when a voltage is applied. Insulating parts 101, 102, and 103 cause dielectric polarization, since the voltage applied to these electrodes varies, and a current is drawn for a while until the polarization is completed. Therefore, when the current flowing in needle 11 and signal pattern 12 is measured, the current measurement must be delayed until this inflow of current drops, even though a determined voltage is applied to needle 11. That is, as a result of the settling time being long, a long measurement waiting time is necessary. Moreover, in the converse case, in which the voltage is removed, a long measurement waiting time is necessary, since a discharging current flows in the same theory.

For example, in the conventional prober interface card shown in FIG. 3, when the terminal voltage is changed to 100 V and measure its current within femtoampere error, it is often the case that several tens of seconds are required for the value of the current caused by dielectric absorption to fall to the femtoampere level. This is a significant problem from the standpoint of improving the speed of low current measurements.

Accordingly, it is an object of the invention to provide a prober interface card which shortens the settling time when low currents are measured.

It is a further object of the invention to provide an improved prober interface card which (I) prevents capacitance linking through the insulating parts between probing needles and signal patterns, and conductors with different potentials and (ii) exhibits improved dielectric absorption characteristics.

SUMMARY OF THE INVENTION

The problems of the prior art are caused by the fact that signal line and other potential conductors form a capacitor and its insulating material has bad dielectric absorption (See C14 if FIG. 14). This capacitance area is referred as the "capacitance space". Such capacitance is present in the spaces between the signal lines (needles) and between conductors with different potentials on a prober interface card.

By means of a prober interface card incorporating the invention, the signal patterns and equipotential guard conductors are arranged in the form of walls, so that as little insulating material as possible, other than air, is present in the capacitance spaces between the signal patterns and the needles, and conductors with different potentials. A marked improvement in the dielectric absorption characteristic is achieved by preventing insulating material from being present between conductors with different potentials.

DETAILED DESCRIPTION OF THE INVENTION

Figure 1:
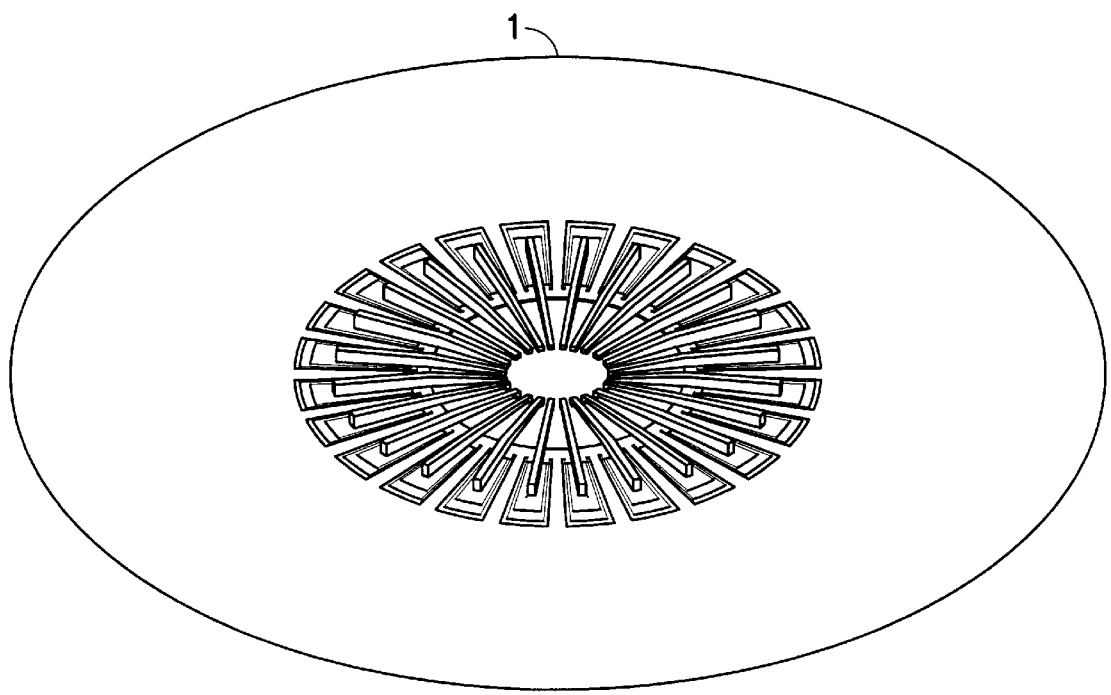
FIG. 1 is a conceptual explanation of a prior art probe card.
Figure 2:
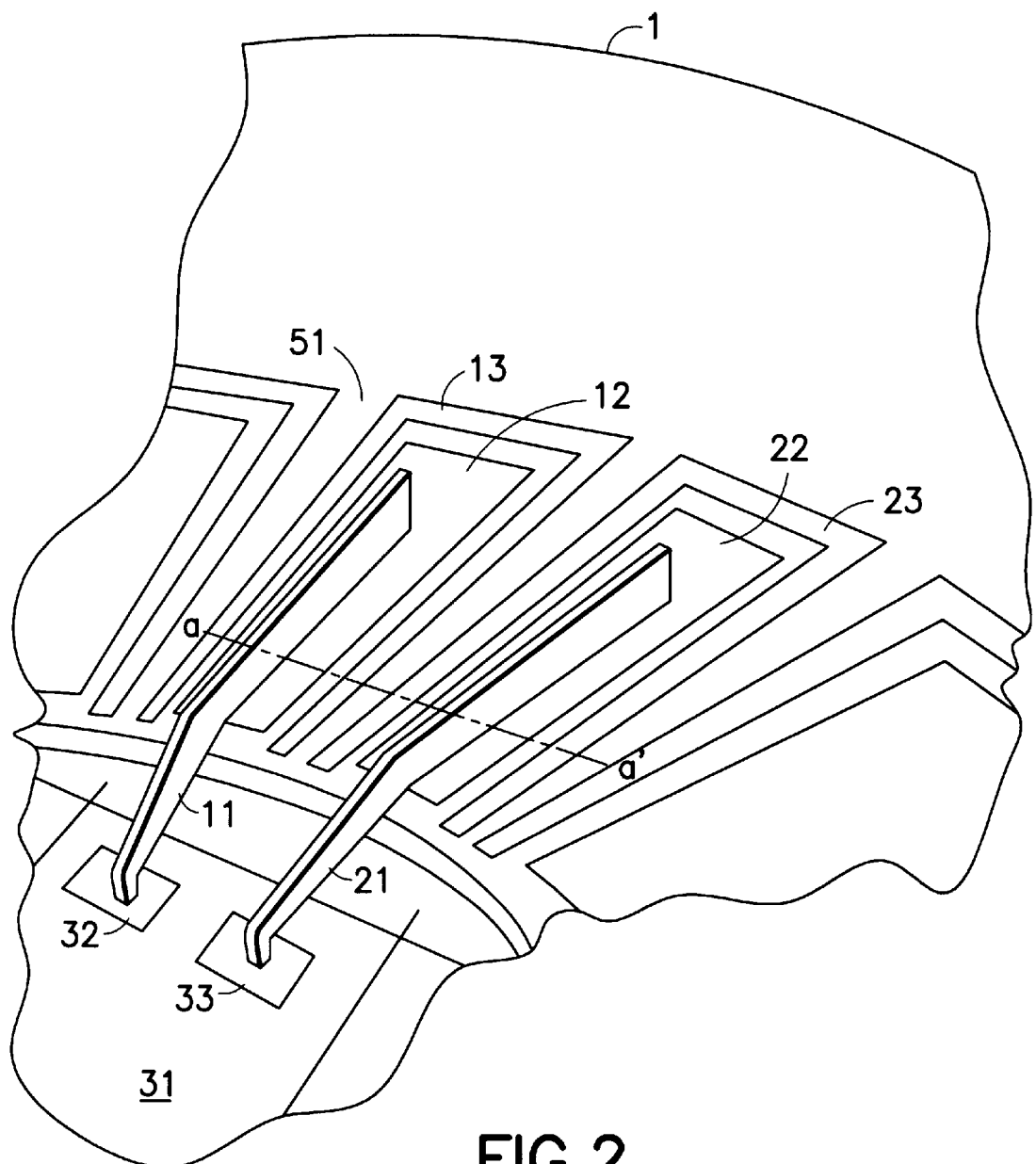
FIG. 2 is an enlarged view of needle mounting part of the probe card shown in FIG. 1.
Figure 3:
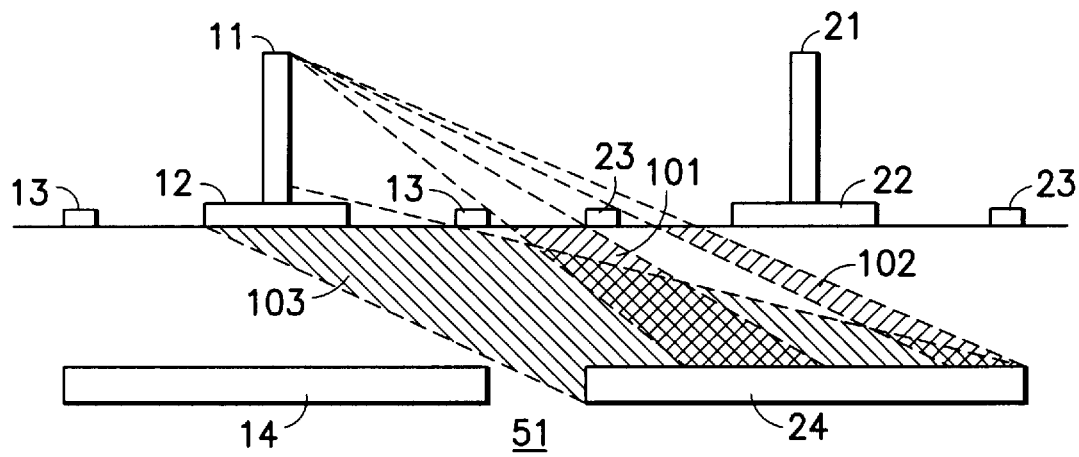
FIG. 3 is a cross sectional view of a needle mounting part shown in FIG. 2.
Figure 4:
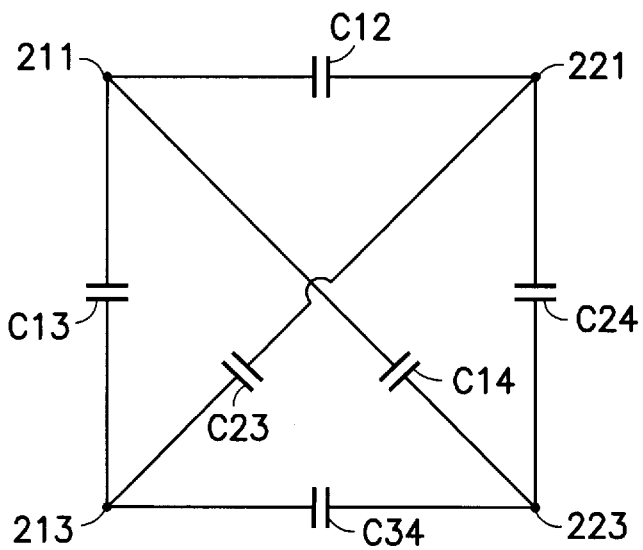
FIG. 4 is an equivalent circuit diagram of the needle mounting part shown in FIG. 3.
Figure 5:
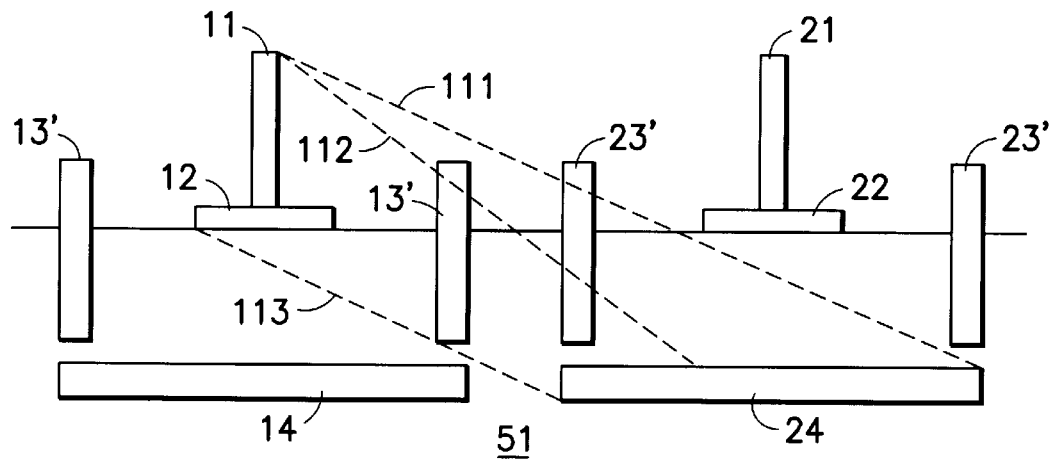
FIG. 5 is a cross sectional view of an embodiment of this invention.

FIG. 5 shows one basic structure of an embodiment of this invention. The elements with the same functions as in the prior art are given the same reference numbers.

In FIG. 5, the conventional side guard patterns are configured as walls, with set heights and depths. The walls are made in such a way that insulating material is not contained in the capacitance spaces between needle 11 with signal pattern 12 and needle 21 and between needle 11 with signal pattern 12 and side guard conductor 23' of needle 21 with lower guard pattern 24. Wall-shaped side guard conductor 23' can be formed, preferably, by using ceramic substrates or through use of other substrates and parts known in the art.

If the height and depth of side guard conductor 13' is sufficient, pathways 111 and 113 from needle 11 to lower guard pattern 24 of the adjacent needle, through the insulating material of the board, are obstructed by the part of side guard conductor 23' which projects above the substrate. Pathway 112 is also obstructed (from the top of the needle 11 to the part of the side guard pattern of the adjacent needle which is embedded in the substrate). Therefore, no insulating part is positioned between the needle and the signal pattern, and conductors with different potentials, and the effect of dielectric absorption is avoided.

As will be clear to those skilled in the art, a certain degree of isolation can be obtained, even when the part above the substrate of the side guard conductor of the embodiment of FIG. 5 is omitted, or if the part of the side guard conductor inside the substrate is omitted.

Figure 6:
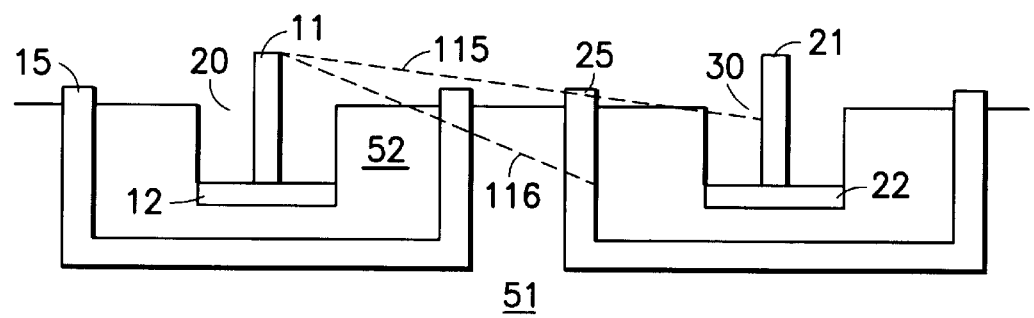
FIG. 6 is a cross sectional view of another embodiment of this invention.

FIG. 6 shows another embodiment of this invention. In this embodiment, needles 11 and 21 and signal patterns 12 and 22 are placed, respectively, in grooves 20 and 30 in the substrate, and guard conductors 15 and 25 form a structure connecting the side guard conductor and the lower guard pattern. By making these grooves, it is possible to lower the height of the attachment parts of the needles and shorten the parts of the guard conductors which project above the substrate. This improves strength and mounting density, by reducing the height of the part.

In FIG. 6, pathway 115 from the top of needle 11 to adjacent needle 21, cutting through the insulating part, is blocked by the part of guard conductor 25 of needle 21 which projects above the substrate. Pathway 116 from the top of needle 11 to the side part of guard conductor 25 of needle 21, cutting through the insulating part, is blocked by guard conductor 15 of needle 11. It should be noted that, since the side and bottom parts of the guard conductor are connected, the pathway from the top of needle 11 to the bottom of guard conductor 25 of needle 21 is always blocked by the side part.

Figure 7:
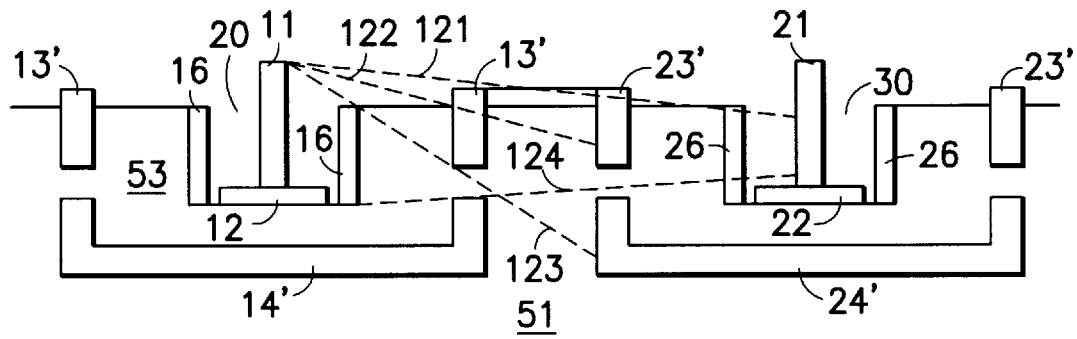
FIG. 7 is a cross sectional view of another embodiment of this invention.

Moreover, FIG. 7 shows a yet another embodiment of this invention. In FIG. 7, by making groove part guard patterns 16 and 26 on both sides of grooves 20 and 30 in which the needles are placed (so that they do not contact signal patterns 12 and 22), the parts of the side guard conductors in the substrate can be omitted. Side guard conductors 13' and 23' can be separated from the bottom guard conductors 14' and 24', with their ends pointed upward. This is advantageous from the standpoint of strength, since insulating part 53, enclosed by the guard conductors, is difficult to peel off, etc.

In FIG. 7, pathway 121 from the top of needle 11 to adjacent needle 21, cutting through the insulating part, is blocked by the projecting part of side guard conductor 23' of the adjacent needle and groove guard pattern 26. Pathway 122 from the top of needle 11 to side guard conductor 23' of the adjacent needle, cutting through the insulating part, is blocked by side guard conductor 13' of needle 11. Pathway 124 from the bottom of signal pattern 12 to adjacent needle 21, cutting through the insulating material between side guard conductor 13' and the bent part of bottom guard conductor 14', is blocked by groove guard pattern 16 of needle 11 and groove guard pattern 26 of needle 21.

Thus, by choosing a suitable height and depth of the side guard conductor and a height of the curved part of the lower guard conductor, a structure can be formed in which there is no insulating material in the capacitance spaces connecting adjacent needles with different potentials.

Figure 8:
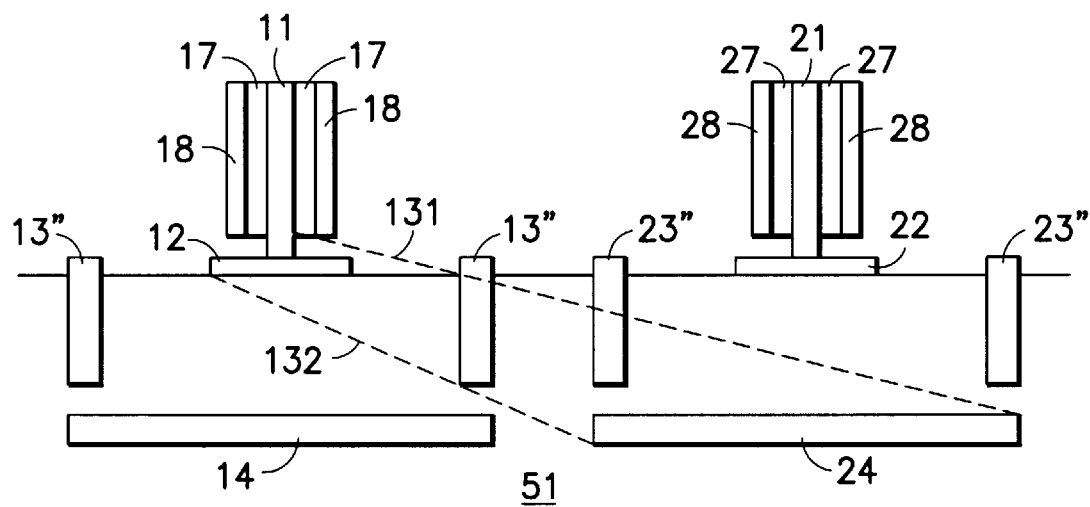
FIG. 8 is a cross sectional view of another embodiment of this invention.

FIG. 8 shows still another embodiment of this invention. FIG. 8 is characterized by the fact that a slightly projecting part is placed on the side guard and a guard structure is placed on the sides of the needles. That is, wall-shaped side guard conductors 13" and 23" are formed in the substrate; the parts projecting above the substrate are short, and insulating parts 17 and 27 are placed on both sides of needle 11. These parts support needle part guard conductors 18 and 28. Needle part guard conductors 18 and 28 are kept at the same potential as needle 11. Therefore, the parts of needle 11 from which insulating parts and conductors with different potentials can be seen, are made markedly smaller. Even the very small parts of needle 11, from which insulating parts and conductors with different potentials can be seen, are blocked by side guard conductors 13" and 23", as shown by pathway 131. Pathway 132, which cuts through the insulating material from the bottom of signal pattern 12 to lower guard pattern 24 of the adjacent needle is also blocked by side guard conductor 13".

The embodiments of this invention show a measuring device with an active guard, but a certain degree of effectiveness can also be obtained if the guard of this invention is changed to a passive guard, as will be readily understood by those skilled in the art.

As a result of this invention, a prober interface card exhibits improved dielectric absorption characteristics in spaces between probing needles and signal patterns, and adjacent conductors with different potentials. Moreover, by using the prober interface card of this invention, low current measurements can be made more rapidly.

While embodiments of this invention were shown above, the invention is not limited to the methods, arrangements, and other aspects of the embodiments shown; changes in the make-up of the invention are permitted, if desired, as long as the gist of this invention is preserved.

We claim:

1. In a prober interface card for connecting a measurement device and a plurality of terminals on a wafer, a plurality of needles being mounted on said prober interface card for connection to terminals on a wafer, said prober interface card comprising a dielectric substrate, the improvement comprising:

a signal conductor pattern coupled to each needle;

a conductive guard pattern disposed below each said signal pattern; and guard conductors disposed on both sides of each said signal conductor pattern on a first surface of said dielectric substrate, each said guard conductor configured as a wall which extends both above and below said first surface and into said dielectric substrate, so as to block direct line paths through said dielectric substrate between an associated signal conductor pattern and immediately adjacent conductors and conductive guard patterns having different potentials imposed thereon.

2. In a prober interface card for connecting a measurement device and a plurality of terminals on a wafer, a plurality of needles mounted on said prober interface card for connection to terminals on said wafer, said prober interface card comprising a dielectric substrate, the improvement comprising:

a signal conductor pattern disposed on said substrate and coupled to each of said needles;

a conductive guard pattern disposed on said substrate and below each said signal conductor pattern; and guard conductors disposed on both sides of each said signal conductor pattern, each said guard conductor configured as a wall having a height and width, said height exceeding said width, and positioned to obstruct all line-of-sight pathways through said dielectric substrate between each immediately adjacent signal pattern and associated conductive ground pattern with different potentials.

3. The interface card in accordance with claim 1, further comprising a plurality of grooves on a first surface of said substrate, said needles being disposed in said grooves, said signal pattern disposed on a bottom surface of each said groove.

4. The interface card in accordance with claim 1, further comprising;

insulators disposed on opposed side surfaces of each said needle; and guard conductors positioned about said opposed side surfaces so as to cover said insulators.

* * * * *